United States Patent
Dick et al.

(10) Patent No.: US 10,763,786 B1
(45) Date of Patent: Sep. 1, 2020

(54) DIFFERENTIAL CRYSTAL OSCILLATOR

(71) Applicant: NXP B.V., Eindhoven (NL)

(72) Inventors: Burkhard Dick, Hamburg (DE); Andreas Hans Walter Wichern, Hamburg (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/666,085

(22) Filed: Oct. 28, 2019

(51) Int. Cl.
  *H03B 5/36* (2006.01)
  *H03F 3/45* (2006.01)

(52) U.S. Cl.
  CPC ......... *H03B 5/364* (2013.01); *H03F 3/45183* (2013.01); *H03F 2200/267* (2013.01); *H03F 2203/45298* (2013.01)

(58) Field of Classification Search
  CPC . H03B 5/32; H03B 5/36; H03B 5/364; H03B 5/366; H03B 5/368; H03F 3/45183; H03F 2200/267; H03F 2203/45298
  USPC ......................................... 331/116 FE, 116 R
  See application file for complete search history.

(56) References Cited

U.S. PATENT DOCUMENTS

| | | | | |
|---|---|---|---|---|
| 6,091,307 A * | 7/2000 | Nelson | .................... | H03K 3/011 331/109 |
| 6,696,898 B1 | 2/2004 | Ward et al. | | |
| 6,956,443 B2 * | 10/2005 | Ruffieux | ................ | H03B 5/326 331/107 A |
| 7,733,190 B2 * | 6/2010 | Yajima | .................... | H03B 5/326 331/107 A |
| 7,768,359 B2 | 8/2010 | Chang et al. | | |
| 9,531,323 B1 * | 12/2016 | Khalili | ................. | H03B 5/1228 |
| 2002/0190802 A1 * | 12/2002 | Ruffieux | .................. | H03B 5/06 331/100 |
| 2006/0097800 A1 * | 5/2006 | Guebels | ................... | H03B 5/36 331/46 |
| 2010/0026402 A1 * | 2/2010 | Chang | ...................... | H03B 5/06 331/116 FE |

FOREIGN PATENT DOCUMENTS

WO  2016/014176 A1  1/2016

OTHER PUBLICATIONS

Karthaus, U. "A Differential Two-Pin Crystal Oscillator—Concept, Analysis, and Implementation", IEEE Transactions on Circuits and Systems—II: Express Briefs, vol. 53, No. 10, pp. 1073-1077 (Oct. 10, 2006).

* cited by examiner

*Primary Examiner* — Levi Gannon
(74) *Attorney, Agent, or Firm* — Rajeev Madnawat

(57) ABSTRACT

A differential crystal oscillator circuit is disclosed. The differential crystal oscillator circuit includes an output port. The output port includes a first terminal and a second terminal. A resonance port is included to couple a resonance element to the differential crystal oscillator circuit. The differential crystal oscillator includes a current source. A differential amplifier is included to excite the resonance element. The differential amplifier is coupled to the current source and the resonance port. The differential amplifier includes a plurality of transistors. The differential crystal oscillator circuit further includes a low pass filter that in combination with a transistor in the differential amplifier exhibits characteristics of a high pass filter. The differential amplifier is configured to use the current source as an active load.

15 Claims, 1 Drawing Sheet

US 10,763,786 B1

DIFFERENTIAL CRYSTAL OSCILLATOR

BACKGROUND

A crystal oscillator is an electronic oscillator circuit that uses the mechanical resonance of a vibrating crystal of piezoelectric material to create an electrical signal with a precise frequency. A crystal oscillator, particularly one using a quartz crystal, works by distorting the crystal with an electric field, when voltage is applied to an electrode near or on the crystal. This property is known as electrostriction or inverse piezoelectricity. When the field is removed, the quartz—which oscillates in a precise frequency—generates an electric field as it returns to its previous shape, and this can generate a voltage. The result is that a quartz crystal behaves like an RLC circuit, but with a much higher Q factor. A crystal oscillator circuit is used for the generation of reference frequencies in electronic systems such as transceivers. The crystal oscillator circuit sustains oscillation by taking a voltage signal from the quartz resonator, amplifying it, and feeding it back to the resonator. The rate of expansion and contraction of the quartz is the resonant frequency, and is determined by the cut and size of the crystal. When the energy of the generated output frequencies matches the losses in the circuit, an oscillation can be sustained.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, a differential crystal oscillator circuit is disclosed. The differential crystal oscillator circuit includes an output port. The output port includes a first terminal and a second terminal. A resonance port is included to couple a resonance element to the differential crystal oscillator circuit. The differential crystal oscillator includes a current source. A differential amplifier is included to excite the resonance element. The differential amplifier is coupled to the current source and the resonance port. The differential amplifier includes a plurality of transistors. The differential crystal oscillator circuit further includes a low pass filter and a high pass filter. The differential amplifier is configured to use the current source as an active load.

In some examples, the low pass filter is formed using a first resistor, a capacitor and two cross-coupled transistors in the plurality of transistors and the high pass filter is formed using the first resistor, a second resistor, the capacitor and the plurality of transistors.

In some embodiments, a control port is included that can be used to control the current output of the current source. The current source includes a current source transistor and the gate of the current source transistor is coupled to the control port.

The plurality of transistors of the differential amplifier includes a first transistor and a second transistor, wherein the gate of the first transistor is coupled to the first terminal of the output port and the gate of the second transistor is coupled to a first terminal of a capacitor. The plurality of transistors further includes a third transistor and a fourth transistor, wherein the gate of the fourth transistor is coupled to the second terminal of the output port and a gate of the third transistor is coupled to a second terminal of the capacitor. The gate of the first transistor is also coupled to a first terminal of a first resistor and the gate of the second transistor is coupled to a second terminal of the first resistor. The gate of the fourth transistor is coupled to a first terminal of a second resistor and the gate of the third transistor is coupled to a second terminal of the second resistor. A first terminal of the first transistor is coupled to the first terminal of the output port and a second terminal of the first transistor is grounded. A first terminal of the second transistor is coupled to the second terminal of the output port and a second terminal of the second transistor is grounded. A first terminal of the third transistor is coupled to the first terminal of the output port and a second terminal of the third transistor is grounded. A first terminal of the fourth transistor is coupled to the second terminal of the output port and a second terminal of the fourth transistor is grounded. The gate of the first transistor is coupled to a first terminal of the resonance port. The gate of the fourth transistor is coupled to a second terminal of the resonance port.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. Advantages of the subject matter claimed will become apparent to those skilled in the art upon reading this description in conjunction with the accompanying drawings, in which like reference numerals have been used to designate like elements, and in which:

Figure 1:
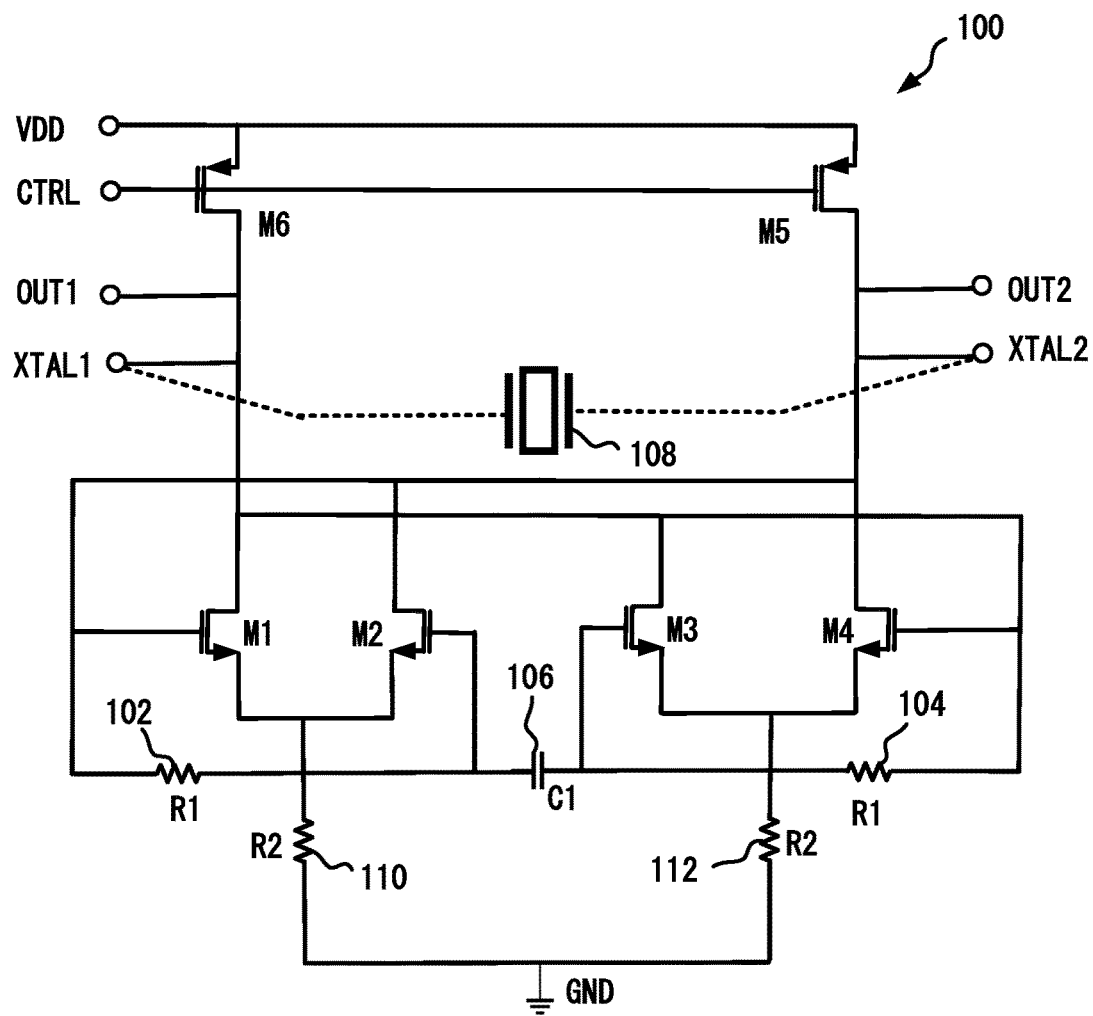
FIG. 1 depicts a differential crystal oscillator circuit in accordance with one or more embodiments of the present disclosure.

Note that figures are not drawn to scale. Intermediate steps between figure transitions have been omitted so as not to obfuscate the disclosure. Those intermediate steps are known to a person skilled in the art.

DETAILED DESCRIPTION

Many well-known manufacturing steps, components, and connectors have been omitted or not described in details in the description so as not to obfuscate the present disclosure.

A typical differential crystal oscillator circuit is disclosed by "Differential Crystal Oscillator Circuit" Pub. No.: WO/2016/014176 PCT No.: PCT/US2015/036055 by Rajavi, Yashar et al. (RAJAVI), which is incorporated herein by reference.

A crystal oscillator is used to generate signals at a stable defined frequency with suitable level, mostly in integrated circuits as reference for other functional blocks, for example phase-locked loops or to directly provide clock signal to digital circuits. In combination with a suitable active circuit, the piezoelectric effect is employed to sustain a stable oscillation at a frequency defined by the mechanical parameters of the crystal. An electrical model of a crystal oscillator can be a capacitor C1, an inductor L1 and a resistor R1 connected in series and this series is connected to a capacitor C0 in parallel. The series resonance of the crystal is given by the series connection of L1 and C1; in combination with C0, which is mainly given by the parasitic capacitance between the electrodes connecting the crystal inside its package. Associated losses are modeled by R1. It should be noted that in most applications, a further external capacitance is connected in parallel to the crystal as "load capacitance" (adding to C0) to fine-tune the arrangement to the desired final frequency as most oscillator circuits operate somewhere between the series and parallel resonance.

RAJAVI discloses a typical differential crystal oscillator. The typical differential crystal oscillator includes a differential transistor pair that is cross-coupled via the gate to drain connections of each other. The loop gain is primarily determined by the currents through transistors and a load. The load is an active load with the electrical characteristic of a coil with losses. For low frequencies, the impedance represented by the circuit is low, while at higher operating frequencies the impedance increases to a much higher value. The slope of the impedance can be adjusted by adjusting the resistive part of the load and the current through transistors in the load. RAJAVI's differential crystal oscillator includes positive feedback. In case the loop gain for frequencies is too high, the typical differential crystal oscillator will latch. This latching may cause the oscillator non-operational. However, if the loop gain is low, the latching condition may not occur. But the loop gain should be high enough to allow secure operation at the crystal resonance frequency. The typical differential crystal oscillator circuit has disadvantages. The active load in the typical differential crystal oscillator circuit may have a significant amount of spread, because its characteristics depend on the spread of the components included in the load and the current through the load. Further, the oscillator current depends on the supply voltage and the amplitude regulation is difficult without modifying the supply voltage.

FIG. 1 depicts a differential crystal oscillator circuit 100. The differential crystal oscillator circuit 100 uses differential input transistor pairs M1/M3 and M3/M4 with emitter resistors 110, 112, both having the same value. The drains of M1 and M3 are coupled to the drain of M6 and the drains of M2 and M4 to the drain of M5, respectively. Thus, the output signals of both differential transistor pairs are added together. The gate of M1 is connected to the drain of M4 and the gate of M4 is connected to the drain of M1 in a cross-coupled configuration, thus creating a positive feedback loop. The load of the input transistors is realized by simple current sources (M6 and M5) with high impedance. Therefore, a high loop gain can easily be realized. The resistors 110, 112 can be modified to tune the common mode rejection ratio (CMRR) of the differential amplifiers, which improves with higher resistance values while reducing open loop gain. The value of R2 can typically be selected to be less than 5 k Ohms, depending on the desired current. In some embodiments, the value can be close to zero. The output signal is present between nodes OUT1 and OUT2 (or pins XTAL1/2), to which also the crystal 108 is connected.

The differential crystal oscillator circuit 100 includes resistor 102 and a resistor 104 both having a value R1. The differential crystal oscillator circuit 100 also includes a capacitor 106 having a value C1. The resistors 102, 104 and the capacitor 106 form a lowpass filter towards the gate of M2 and the gate of M3, respectively. Transistors M1, M2, M3, M4, resistors 102, 104 and the capacitor 106 form a high pass filter employing the common mode rejection capabilities of the differential amplifiers formed by M1, M2, resistor 110 and M3, M4 with resistor 112, respectively, as explained in detail further below. The gate of the transistor M1 is coupled with the drain of M4 and the gate of M4 is coupled with the drain of M1 in a cross-coupled configuration and thus creates a positive feedback loop. A crystal 108 may be connected externally to the terminals XTAL1 and XTAL2. The values of R1, C1 depend on the frequency of the crystal 108. Consequently, the value of R1 and C1 also determine the desired cutoff frequencies for the low and high pass filter arrangement mentioned before. In some embodiments, variable resistors and/or capacitor may be used to tune the differential crystal oscillator circuit 100 according to the frequency of the externally connected crystal 108.

The gate of M1 directly receives the voltage from pin XTAL2 while a low-pass filter formed by resistor 102 and capacitor 106 is inserted towards the gate of M2. Similarly, the gate of M4 receives the voltage from the pin XTAL1 while towards the gate of M3 a lowpass filter formed by the resistor 104 and the capacitor 106 is inserted. Depending on the cutoff frequency of the lowpass filter, the differential amplifier including M1 and M2 has a good common mode suppression below the selected cutoff frequency. For a low frequency close to zero, a latch is avoided. Therefore, a special active load as used in RAJAVI's differential crystal oscillator is not required to be included in the differential crystal oscillator circuit 100. The current source including M6, M5 can be used as load of the input differential amplifiers formed using M1, M2 and M3 with M4. Further, a person skilled in the art would appreciate that a sufficient suppression of unwanted oscillation for a parasitic capacitive load is also provided by the common mode suppression of the overall circuit configuration the differential crystal oscillator circuit 100.

The differential crystal oscillator circuit 100 can be used for low supply voltages and has no uncontrolled DC path from supply voltage (VDD) to ground. The bias current is adjusted by the current sources M6 and M5 and can be controlled by applying a voltage on the CTRL pin (or the control port) that is coupled to the gates of M6 and M5. Using a voltage at the CTRL pin, an amplitude control of the oscillator output can be realized.

Figure 2:
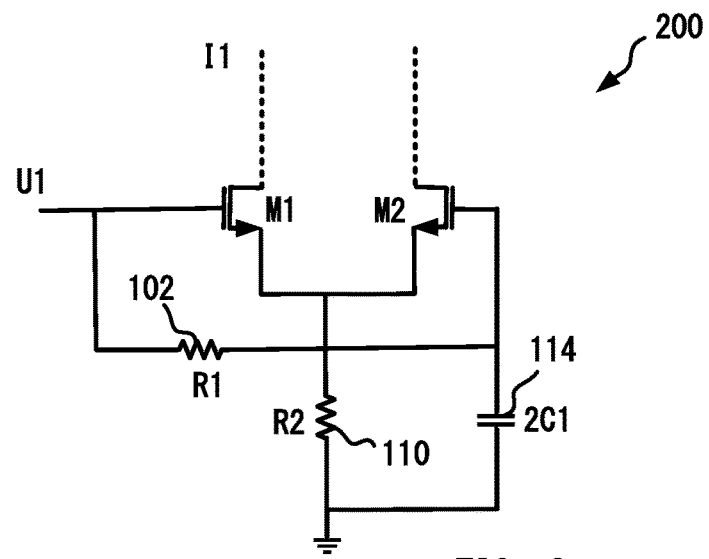
FIG. 2 depicts one section of the differential crystal oscillator circuit of FIG. 1.

FIG. 2 shows a circuit 200 that is a section of the differential crystal oscillator circuit 100 shown in FIG. 1. The resistor 102 and the capacitor 114 form a low-pass towards the gate of M2 and the gate of M3, respectively, as shown in FIG. 2 for one lower half circuit including M1 and M2 of the overall arrangement divided along its symmetry axis for the purpose of explanation. Hence, the value of the capacitor 114 can be 2× the value of the capacitor 106. The gate of M1 directly receives the voltage from pin XTAL2 designated as the complex input voltage U1. The gate of M2 receives the same input voltage via the low-pass arrangement of the resistor 102 and the capacitor 114. Hence, for low frequencies, the input voltages at the two gates (of M1 and M2) are the same, while at higher frequencies the input voltage at the gate of M2 is filtered by the low pass filter. Since the differential arrangement amplifies the difference in input voltage, overall this results in a high-pass characteristic with respect to the output current I1. At low frequencies, the identical input voltages at both gates (M1 and M2) do not result in an output signal I1 as they are the same, being suppressed by the differential amplifier according to the available inherent common mode rejection ratio.

In some examples, the I1/U1 transfer function for the half circuit (e.g., the circuit 200), assuming a conversion factor c from differential input voltage to output current, is given by $$c*(jw2C1R1/(1+jw2C1R1))$$ (EQ1)

EQ1 presents a high-pass characteristic. This transfer function also holds true for the other half of the circuit with respective circuit elements, where M4 receives the complex voltage U1 from XTAL1 while the lowpass filter (including the resistor 104 and the capacitor 114) is located in the connection to the transistor M3.

For the full symmetric low/high-pass arrangement as shown in FIG. 1, the transfer function is similar to EQ1, because the input voltage to each of the half circuits is now one half of U1 (between XTAL1 and XTAL2 inputs).

For the full circuit as shown in FIG. 1, depending on the cutoff frequency of the low-pass, the differential amplifiers M1/M2 and M3/M4 have a good common mode suppression below this cutoff frequency. For a low frequency close to zero, a latching condition is avoided. Therefore, a special active load as used in RAJAVI is not needed. A sufficient suppression of unwanted oscillation at lower frequencies for a parasitic capacitive load is also provided by the common mode suppression of the overall circuit configuration.

The differential crystal oscillator circuit 100 can be used for low supply voltages even below one Volt and has no uncontrolled DC path from supply voltage (VDD) to ground. The bias current is adjusted by the current sources M6 and M5 and can be controlled by, for example, the voltage on pin CNTRL. Therefore, an amplitude control of the oscillator can easily be realized.

Due to the use of current sources as load, high loop gain and good isolation to the supply voltage are achieved, i.e., superior ripple and supply noise rejection is achieved. Latching conditions for low frequencies close to zero are avoided by the common mode suppression topology of the differential crystal oscillator circuit 100. The differential crystal oscillator circuit 100 also provides suppression of parasitic oscillation. The differential crystal oscillator circuit 100 may operate at low supply voltages, e.g., less than 1V.

Some or all of these embodiments may be combined, some may be omitted altogether, and additional process steps can be added while still achieving the products described herein. Thus, the subject matter described herein can be embodied in many different variations, and all such variations are contemplated to be within the scope of what is claimed.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. A differential crystal oscillator circuit, comprising:
an output port including a first terminal and a second terminal;
a resonance port to couple a resonance element;
a current source;
a differential amplifier coupled to the current source and the resonance port, wherein the differential amplifier includes a plurality of transistors, a resistor and a capacitor, wherein the resistor and the capacitor form a low pass filter that in combination with a transistor in the differential amplifier exhibits characteristics of a high pass filter; and
wherein the differential amplifier is configured to use the current source as an active load, wherein the active load including a control port to receive an external biasing voltage to control amplitude of an output signal at the output port.

2. The differential crystal oscillator circuit of claim 1, wherein the low pass filter is formed using a first resistor, the capacitor and two cross-coupled transistors in the plurality of transistors.

3. The differential crystal oscillator circuit of claim 2, wherein the high pass filter is formed using the first resistor, a second resistor, the capacitor and the plurality of transistors.

4. The differential crystal oscillator circuit of claim 1, further including a control port to enable controlling the current source.

5. The differential crystal oscillator circuit of claim 4, wherein the current source includes a current source transistor, wherein a gate of the current source transistor is coupled to the control port.

6. The differential crystal oscillator circuit of claim 1, wherein the plurality of transistors includes a first transistor and a second transistor, wherein a gate of the first transistor is coupled to the second terminal of the output port and a gate of the second transistor is coupled to a first terminal of the capacitor.

7. The differential crystal oscillator circuit of claim 6, wherein the plurality of transistors further includes a third transistor and a fourth transistor, wherein a gate of the fourth transistor is coupled to the second terminal of the output port and a gate of the third transistor is coupled to a second terminal of the capacitor.

8. The differential crystal oscillator circuit of claim 6, wherein the gate of the first transistor is coupled to a first terminal of a first resistor and the gate of the second transistor is coupled to a second terminal of the first resistor.

9. The differential crystal oscillator circuit of claim 7, wherein the gate of the fourth transistor is coupled to a first terminal of a second resistor and the gate of the third transistor is coupled to a second terminal of the second resistor.

10. The differential crystal oscillator circuit of claim 6, wherein a first terminal of the first transistor is coupled to the first terminal of the output port and a second terminal of the first transistor is grounded.

11. The differential crystal oscillator circuit of claim 6, wherein a first terminal of the second transistor is coupled to the second terminal of the output port and a second terminal of the second transistor is grounded.

12. The differential crystal oscillator circuit of claim 7, wherein a first terminal of the third transistor is coupled to the first terminal of the output port and a second terminal of the third transistor is grounded.

13. The differential crystal oscillator circuit of claim 7, wherein a first terminal of the fourth transistor is coupled to the first terminal of the output port and a second terminal of the fourth transistor is grounded.

14. The differential crystal oscillator circuit of claim 6, wherein the gate of the first transistor is coupled to a first terminal of the resonance port.

15. The differential crystal oscillator circuit of claim 7, wherein the gate of the fourth transistor is coupled to a second terminal of the resonance port.

\* \* \* \* \*